United States Patent
Economy et al.

(10) Patent No.: US 11,990,528 B2
(45) Date of Patent: May 21, 2024

(54) ASSEMBLIES HAVING CONDUCTIVE STRUCTURES WITH THREE OR MORE DIFFERENT MATERIALS

(71) Applicant: Lodestar Licensing Group LLC, Evanston, IL (US)

(72) Inventors: David Ross Economy, Boise, ID (US); Rita J. Klein, Boise, ID (US); Jordan D. Greenlee, Boise, ID (US); John Mark Meldrim, Boise, ID (US); Brenda D. Kraus, Boise, ID (US); Everett A. McTeer, Boise, ID (US)

(*) Notice: Subject to any disclaimer, the term of this patent is extended or adjusted under 35 U.S.C. 154(b) by 0 days.

(21) Appl. No.: 18/083,428

(22) Filed: Dec. 16, 2022

(65) Prior Publication Data

US 2023/0121315 A1 Apr. 20, 2023

Related U.S. Application Data

(63) Continuation of application No. 17/180,312, filed on Feb. 19, 2021, now Pat. No. 11,705,500, which is a continuation of application No. 16/458,400, filed on Jul. 1, 2019, now Pat. No. 10,957,775.

(51) Int. Cl.
| | |
|---|---|
| *H01L 29/49* | (2006.01) |
| *H10B 41/10* | (2023.01) |
| *H10B 41/27* | (2023.01) |
| *H10B 43/10* | (2023.01) |
| *H10B 43/27* | (2023.01) |
| *H10B 41/35* | (2023.01) |
| *H10B 43/35* | (2023.01) |

(52) U.S. Cl.
CPC ......... *H01L 29/4966* (2013.01); *H10B 41/10* (2023.02); *H10B 41/27* (2023.02); *H10B 43/10* (2023.02); *H10B 43/27* (2023.02); *H10B 41/35* (2023.02); *H10B 43/35* (2023.02)

(58) Field of Classification Search
CPC .......... H01L 29/4966; H01L 29/40117; H01L 29/42324; H01L 29/4234; H01L 29/42372; H01L 29/49; H10B 41/10; H10B 41/27; H10B 43/10; H10B 43/27; H10B 41/35; H10B 43/35; H10B 41/30; H10B 43/30
USPC ....................................................... 257/314
See application file for complete search history.

(56) References Cited

U.S. PATENT DOCUMENTS

| | | |
|---|---|---|
| 8,124,478 B2 | 2/2012 | Park et al. |
| 10,283,524 B1 | 5/2019 | Greenlee et al. |
| 10,304,851 B2 | 5/2019 | Nakaki et al. |

(Continued)

FOREIGN PATENT DOCUMENTS

| | | |
|---|---|---|
| EP | 20834115 | 7/2022 |
| JP | 2019-050270 | 3/2019 |

(Continued)

*Primary Examiner* — Tong-Ho Kim
(74) *Attorney, Agent, or Firm* — Brooks, Cameron & Huebsch, PLLC

(57) ABSTRACT

Some embodiments include a memory array having a vertical stack of alternating insulative levels and control gate levels. Channel material extends vertically along the stack. The control gate levels comprising conductive regions. The conductive regions include at least three different materials. Charge-storage regions are adjacent the control gate levels. Charge-blocking regions are between the charge-storage regions and the conductive regions.

16 Claims, 7 Drawing Sheets

(56) References Cited

U.S. PATENT DOCUMENTS

| | | |
|---|---|---|
| 10,516,025 B1 | 12/2019 | Nishikawa et al. |
| 10,957,775 B2 | 3/2021 | Economy et al. |
| 11,705,500 B2 * | 7/2023 | Economy ............... H10B 43/27 257/314 |
| 2008/0061360 A1 | 3/2008 | Oh et al. |
| 2008/0237700 A1 | 10/2008 | Kim et al. |
| 2010/0029073 A1 | 2/2010 | Park et al. |
| 2011/0294290 A1 | 12/2011 | Nakanishi et al. |
| 2012/0280296 A1 | 11/2012 | Baars et al. |
| 2013/0069138 A1 | 3/2013 | Alsmeier et al. |
| 2014/0054675 A1 * | 2/2014 | Lee ....................... H10B 43/27 438/269 |
| 2015/0380089 A1 | 12/2015 | Aritome |
| 2016/0149002 A1 | 5/2016 | Sharangpani et al. |
| 2018/0219017 A1 | 8/2018 | Goda et al. |
| 2019/0067490 A1 | 2/2019 | Yang et al. |
| 2019/0081064 A1 * | 3/2019 | Nakaki ............... H01L 29/1095 |
| 2020/0328284 A1 | 10/2020 | Greenlee et al. |

FOREIGN PATENT DOCUMENTS

| | | |
|---|---|---|
| KR | 10-2010-0005604 | 1/2010 |
| WO | WO PCT/US2020/032489 | 8/2020 |
| WO | WO PCT/US2020/032489 | 12/2021 |

* cited by examiner

ASSEMBLIES HAVING CONDUCTIVE STRUCTURES WITH THREE OR MORE DIFFERENT MATERIALS

RELATED PATENT DATA

This patent resulted from a continuation of U.S. patent application Ser. No. 17/180,312 filed Feb. 19, 2021, which is a continuation of U.S. patent application Ser. No. 16/458,400 filed Jul. 1, 2019, now U.S. Pat. No. 10,957,775, each of which is hereby incorporated by reference herein.

TECHNICAL FIELD

Assemblies (e.g., integrated NAND) having conductive structures (e.g., wordlines) with three or more different materials.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved NAND architecture.

BRIEF DESCRIPTION OF THE DRAWINGS

FIG. 5 is along the line 5-5 of FIG. 5A.

DETAILED DESCRIPTION OF THE ILLUSTRATED EMBODIMENTS

Some embodiments include NAND memory arrays having conductive structures (e.g., wordlines) which contain at least three different materials (which may be metal-containing materials in some embodiments). Example embodiments are described with reference to FIGS. 5-7.

Figure 1:
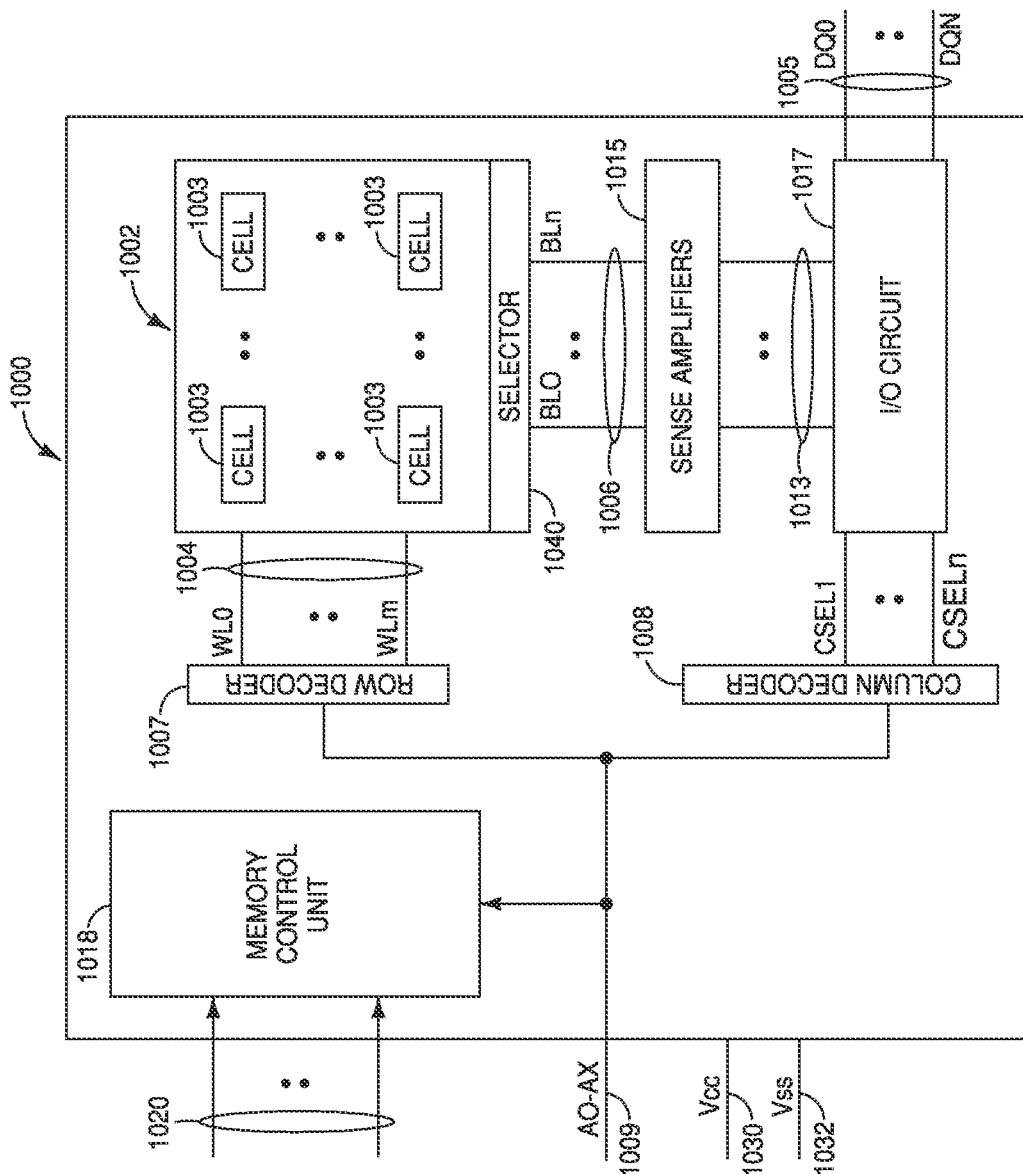
FIG. 1 shows a block diagram of a prior art memory device having a memory array with memory cells.
Figure 2:
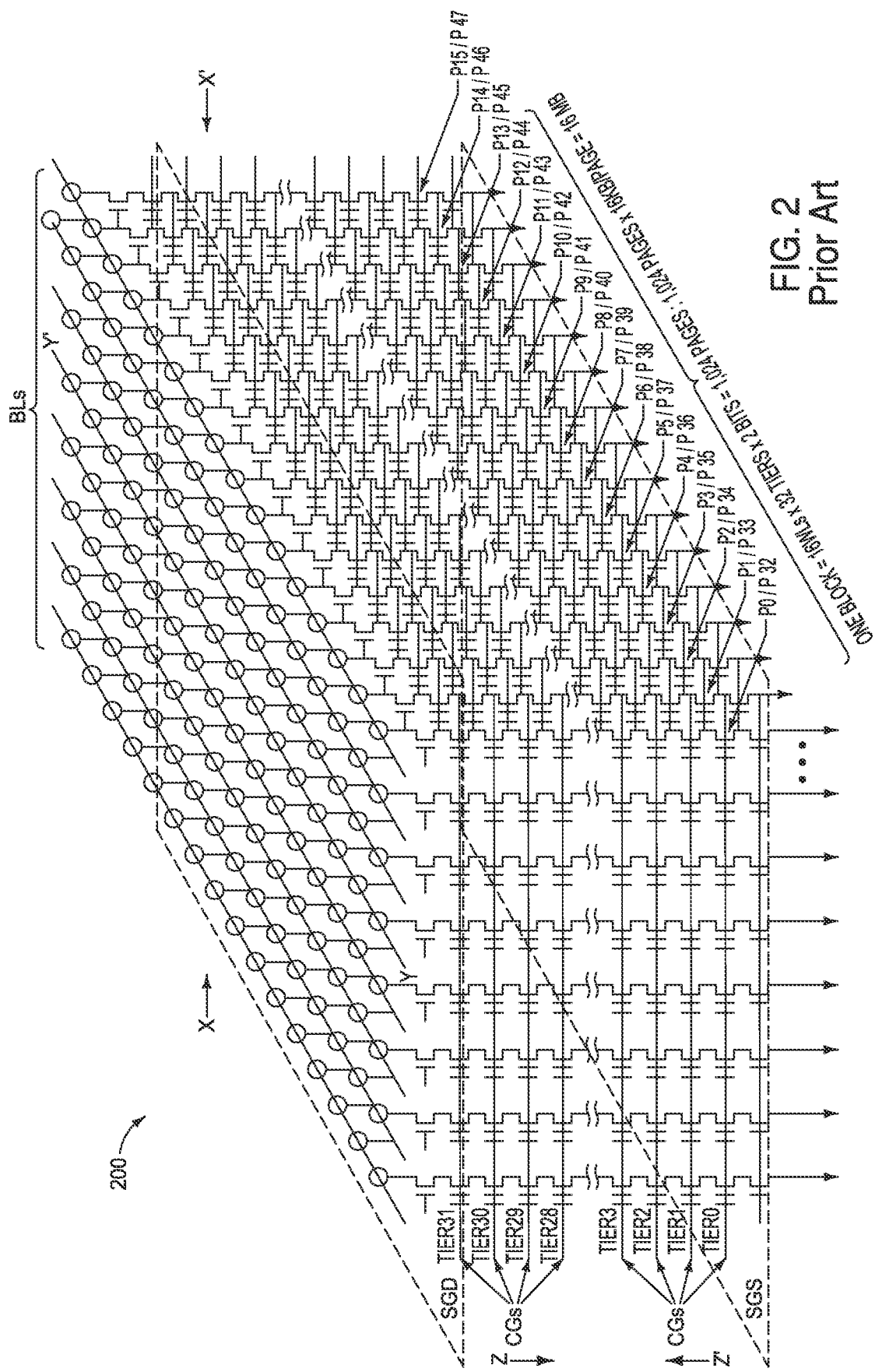
FIG. 2 shows a schematic diagram of the prior art memory array of FIG. 1 in the form of a 3D NAND memory device.
Figure 3:
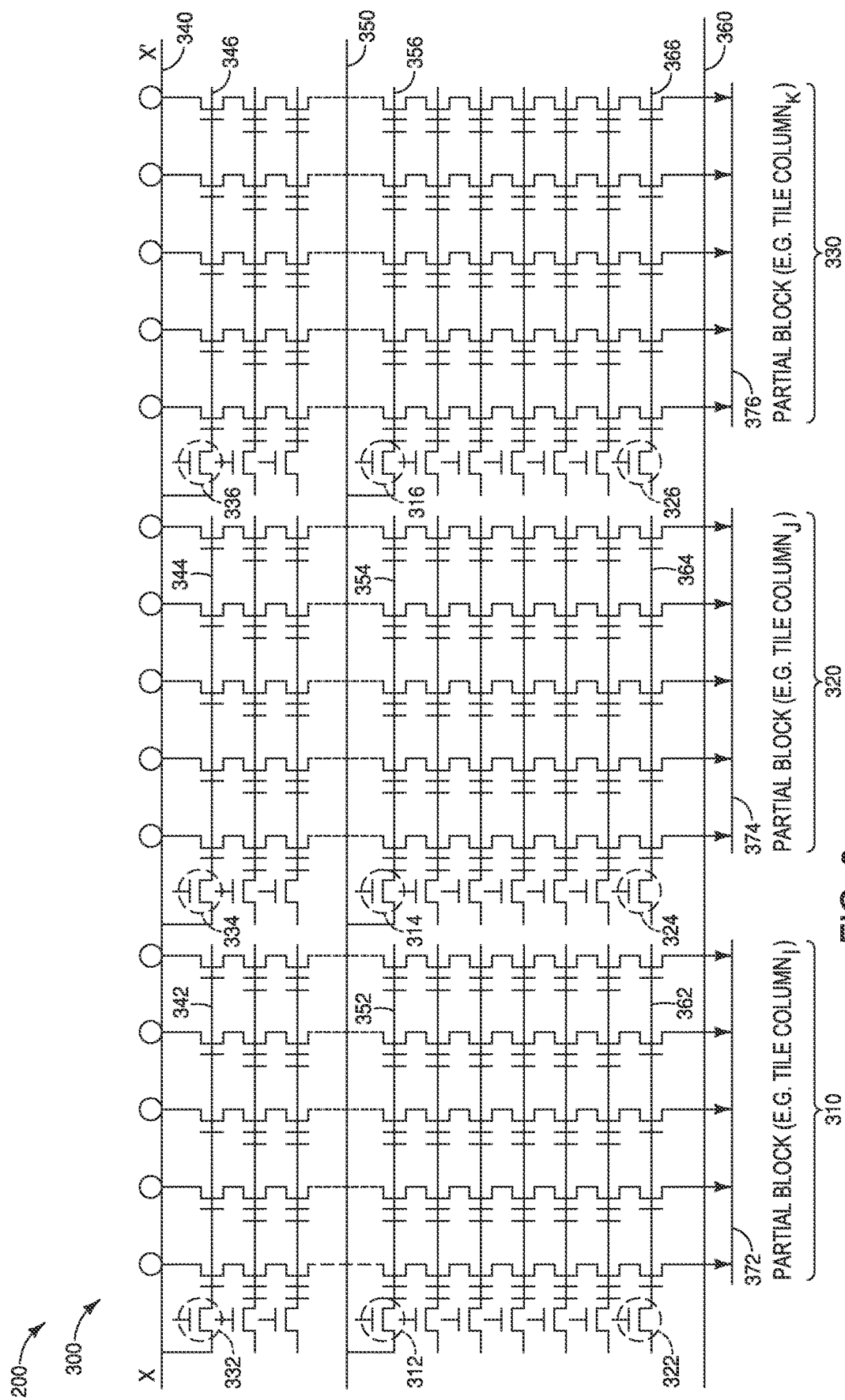
FIG. 3 shows a cross-sectional view of the prior art 3D NAND memory device of FIG. 2 in an X-X' direction.
Figure 4:
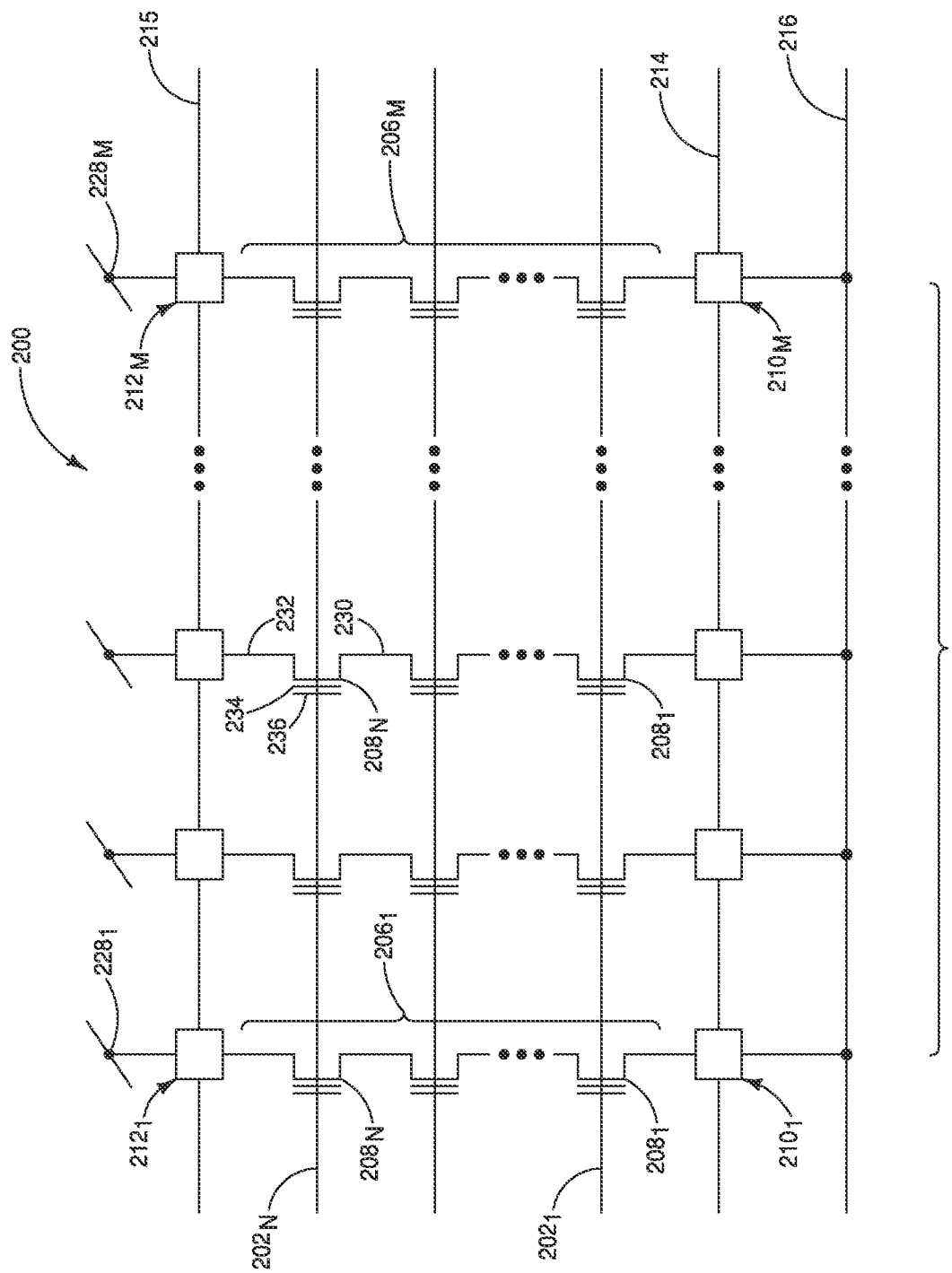
FIG. 4 is a schematic diagram of a prior art NAND memory array.
Figure 5:
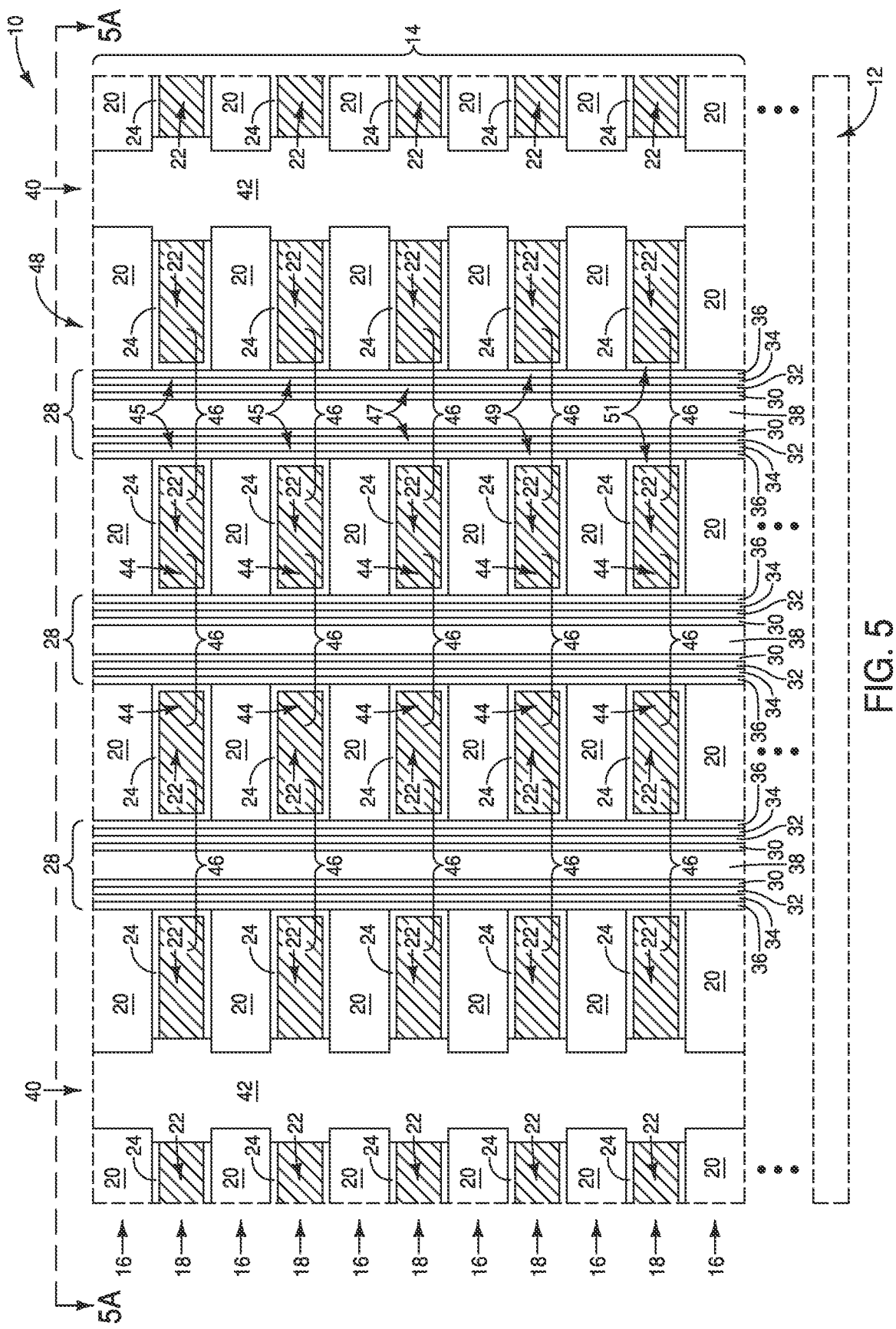
FIG. 5 is a diagrammatic cross-sectional side view of a region of an integrated assembly comprising an example memory array.
Figure 5A:
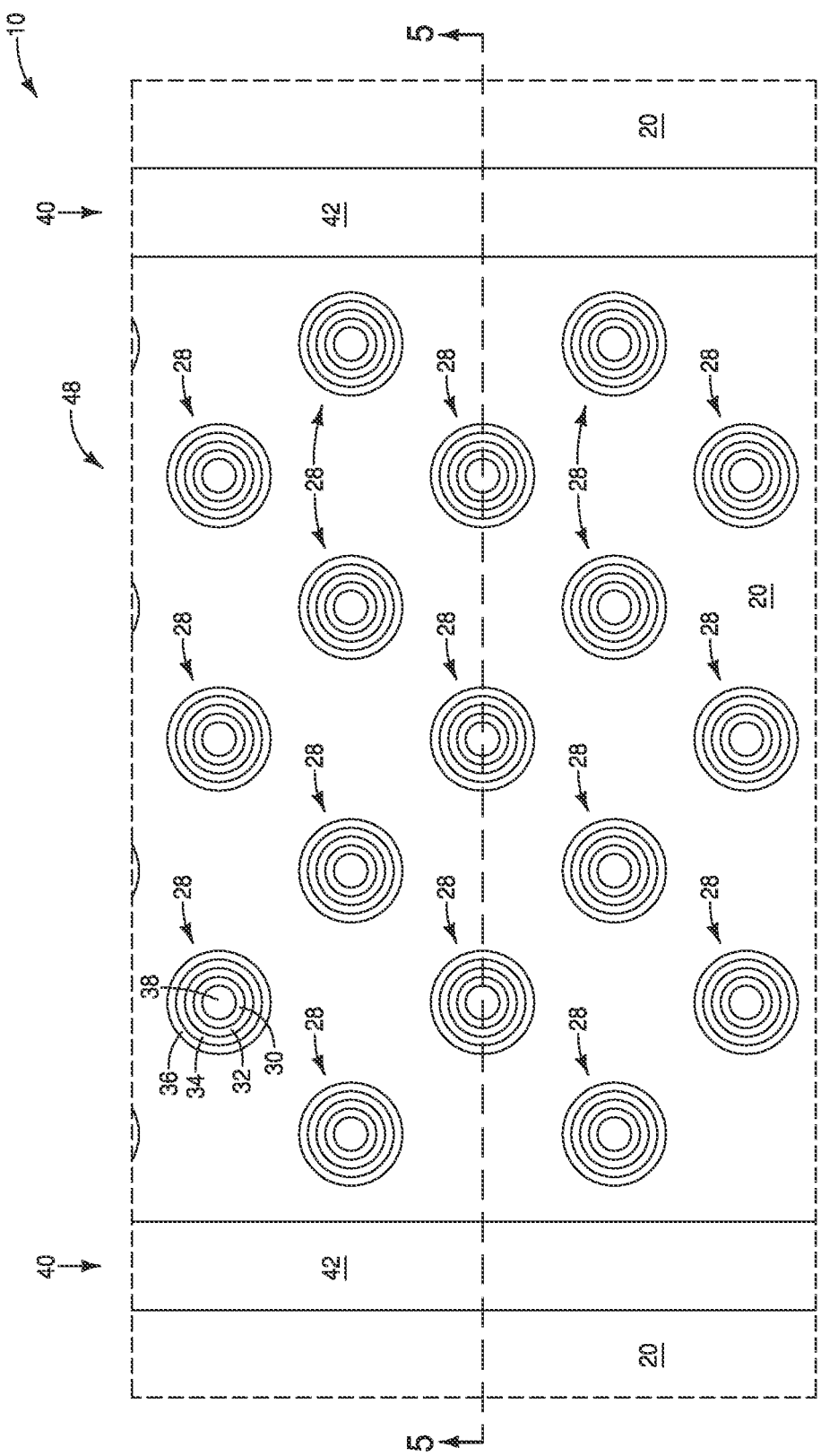
FIG. 5A is a diagrammatic top-down view along the line 5A-5A of FIG. 5.

Referring to FIGS. 5 and 5A, a construction 10 (which may also be referred to as an integrated assembly, or as an integrated structure) includes a stack 14 of alternating first and second levels 16 and 18.

The first levels 16 comprise insulative material 20, and the second levels 18 comprise conductive regions 22. The levels 16 and 18 may be of any suitable thicknesses. The levels 16 may be of different thicknesses than the levels 18, or may be the same thicknesses as the levels 18. In some embodiments, the levels 16 and 18 may have thicknesses within a range of from about 5 nanometers (nm) to about 100 nm, within a range of from about 5 nm to about 50 nm, etc. In some embodiments, the conductive regions 22 may have thicknesses within a range of from about 10 nm to about 100 nm.

The insulative material 20 may comprise any suitable composition or combination of compositions; and in some embodiments may comprise, consist essentially of, or consist of silicon dioxide.

Insulative material 24 extends around the conductive regions 22. The insulative material 24 may correspond to dielectric-barrier material; and may comprise any suitable composition(s). In some embodiments, the dielectric-barrier material 24 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 24 is shown to be a single homogenous material, in other embodiments the insulative material may comprise two or more discrete compositions.

The conductive regions 22 comprise conductive wordlines. In some embodiments, the conductive levels 18 may be referred to as wordline levels (control gate levels, memory cell levels) of a NAND configuration. The NAND configuration can include a string of memory cells (a so-called NAND string), with the number of memory cells in the string being determined by the number of memory cell levels 18. The NAND string may comprise any suitable number of memory cell levels. For instance, the NAND string may have 8 memory cell levels, 16 memory cell levels, 32 memory cell levels, 64 memory cell levels, 512 memory cell levels, 1024 memory cell levels, etc.

The levels 16 may be referred to as insulative levels which alternate with the wordline levels (control gate levels) 18 within the stack 14. Such insulative levels 16 may be considered to include the insulative material 20.

Structures 28 extend through the stack 14. The structures 28 may be referred to as channel material structures in that they comprise channel material 30. The channel material 30 comprises semiconductor material; and may comprise any suitable composition or combination of compositions. For instance, the channel material 30 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15).

Tunneling material (gate dielectric material) 32, charge-storage material 34 and charge-blocking material 36 are between the channel material 30 and the vertically-stacked levels 16/18. The tunneling material, charge-storage material and charge-blocking material may comprise any suitable compositions or combinations of compositions.

In some embodiments, the tunneling material 32 may comprise, for example, one or more of silicon dioxide, aluminum oxide, hafnium oxide, zirconium oxide, etc.

In some embodiments, the charge-storage material 34 may comprise charge-trapping materials, such as silicon nitride, silicon oxynitride, conductive nanodots, etc. In alternative embodiments, the charge-storage material 34 may be configured to include floating gate material (such as, for example, polycrystalline silicon).

In some embodiments, the charge-blocking material 36 may comprise one or more of silicon dioxide, aluminum oxide, hafnium oxide, zirconium oxide, etc.

In the illustrated embodiment, the channel material 30 is configured as annular rings within each of the structures 28. Insulative material 38 fills such annular rings. The insulative material 38 may comprise any suitable composition or combination of compositions, such as, for example, silicon dioxide. The illustrated structures 28 may be considered to comprise hollow channel configurations, in that the insulative material 38 is provided within "hollows" in the annular ring-shaped channel configurations. In other embodiments (not shown), the channel material may be configured as a solid pillar configuration.

The channel material structures 28 may be considered to comprise all of the materials 30, 32, 34, 36 and 38 in combination. The top view of FIG. 5A shows that the channel material structures 28 may be arranged in a hexagonally-packed pattern.

Slits (trenches) 40 extend through the stack 14, and such slits are filled with insulative material 42. The insulative material 42 may comprise any suitable composition(s), and in some embodiments may comprise, consist essentially of, or consist of silicon dioxide.

In some embodiments, the stack 14 may be considered to be a vertically-extending stack, and the structures 28 may be considered to be vertically-extending channel material structures which pass through the stack 14.

The stack 14 is over a supporting base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the stack 14 to diagrammatically indicate that there may be one or more additional materials, components, etc., provided between the base 12 and the stack 14. Such additional components may include, for example, conductive source lines, select gates, etc.

The wordline levels (control gate levels) 18 comprise conductive gates 44 (only some of which are labeled) adjacent the channel material structures 28. The conductive gates 44, together with regions of the dielectric-barrier material 24, regions of the charge-blocking material 36, regions of the charge-storage material 34, regions of the tunneling material 32, and regions of the channel material 30, form memory cells 46. Such memory cells are incorporated into a three-dimensional NAND memory array 48 analogous to the NAND memory arrays described above with reference to FIGS. 1-4. The memory cells 46 are all substantially identical to one another (with the term "substantially identical" meaning identical to within reasonable tolerances of fabrication and measurement).

In operation, the charge-storage material 34 forms charge-storage regions 45 (only some of which are labeled) of the memory cells 46. The charge-storage material 34 may be configured to store information in the memory cells 46. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 44, and/or based on the value of voltage applied to an associated channel material 30.

The tunneling material 32 forms tunneling regions 47 (only some of which are labeled) of the memory cells 46. Such tunneling regions may be configured to allow desired migration (e.g., transportation) of charge (e.g., electrons) between the charge-storage material 34 and the channel material 30. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 36 is adjacent to the charge-storage material 34 and forms charge-blocking regions 49 (only some of which are labeled) of the memory cells 46. The charge-blocking regions may provide a mechanism to block charge from flowing from the charge-storage material 34 to the associated gates 44.

The dielectric-barrier material 24 is provided between the charge-blocking material 36 and the associated gates 44, and may be utilized to inhibit back-tunneling of charge carriers from the gates 44 toward the charge-storage material 34. In some embodiments, the dielectric-barrier material 24 may be considered to form dielectric-barrier regions 51 (only some of which are labeled) within the memory cells 46.

Figure 6:
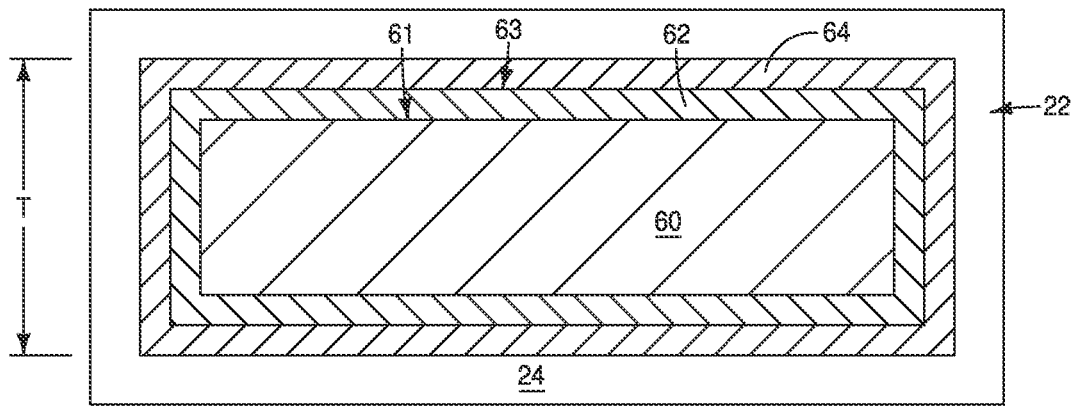
FIG. 6 is a diagrammatic cross-sectional enlarged view of a conductive region of the example memory array of FIG. 5 illustrating an example arrangement of materials within the conductive region.

In some embodiments, the conductive regions 22 include three or more different materials. FIG. 6 shows an enlarged view of one of the conductive regions 22 to better illustrate an example configuration of the conductive region.

The conductive region 22 of FIG. 6 includes a first material 60, a second material 62, and a third material 64. Although three materials are shown, it is to be understood that in other embodiments the conductive region 22 may comprise more than three materials. In some embodiments, all three of the materials 60, 62 and 64 may be electrically conductive, and may be metal-containing materials.

The first material 60 may be referred to as an inner material (or as a core material).

The inner material 60 has an outer periphery 61, and the second material 62 extends around the periphery 61 of the first material 60 along the cross-section of FIG. 6. The second material 62 is directly adjacent to the first material 60. The second material 62 has an outer periphery 63, and the third material 64 extends around the periphery 63 of the second material 62 along the cross-section of FIG. 6. The third material 64 is directly adjacent to the second material 62. In the illustrated embodiment, the third material 64 is also directly adjacent to the dielectric-barrier material 24.

The materials 60, 62 and 64 are compositionally different from one another.

The material 60 may be chosen to have low resistance (i.e., high conductivity), and in some embodiments may comprise, consist essentially of, or consist of one or more of cobalt (Co), molybdenum (Mo), nickel (Ni), ruthenium (Ru) and tungsten (W). The material 60 may comprise only metal in some embodiments, rather than comprising metal in combination with non-metal elements.

The second material 62 may be chosen to provide good adhesion to both the third material 64 and the first material 60 (i.e., may be utilized to provide a bonding transition from the third material 64 to the first material 60). The second material 62 may also be chosen to promote growth of large grains within the first material 60. An advantage of having large grains within the conductive material 60 can be that large grains often provide improved conductivity within a conductive material as compared to small grains. The second material 62 may also be chosen to have low stresses along the interfaces with the first material 60 and the third material 64 (i.e., along the boundaries 61 and 63). Although the second material 62 is shown to be an electrically conductive material, it is to be understood that in some embodiments the second material may instead be an electrically insulative material; provided that the second material 62 is thin enough and/or leaky enough to enable the conductive region 22 to retain suitable conductive properties for utilization in wordlines of a NAND assembly.

In some embodiments, the second material 62 may comprise one or more compositions selected from the group consisting of metal nitrides, metal carbides, metal borides, metal oxides and metal carbonitrides. In some embodiments, the second material 62 may comprise, consist essentially of, or consist of one or more of AlO, CeO, HfO, IrO, NiO, RuO, SiN, SiO, TaO, TiN, TiO, WN and ZrO; where the formulas indicate primary constituents rather than specific stoichiometries.

In the illustrated embodiment of FIG. 6, the second material 62 is continuous (i.e., is a continuous layer, or a continuous film, extending around the periphery 61 of the core material 60). In other embodiments, the second material 62 may be discontinuous (as discussed in more detail below with reference to FIG. 7).

Referring still to FIG. 6, the third material 64 may be chosen to adhere well to the dielectric-barrier material 24 and/or to have a high work function (e.g., a work function of at least about 4.3 electronvolts (eV) at a temperature of about 20° C.). In some embodiments, the third material 64 may comprise one or more compositions selected from the group consisting of metal nitrides and metal silicon nitrides. In some embodiments, the third material may comprise, consist essentially of, or consist of one or more of MoN, MoSiN, TiN, TiSiN, WN and WSiN; where the formulas indicate primary constituents rather than specific stoichiometries.

The utilization of at least three materials within the conductive regions 22 may enable properties of the conductive regions (e.g., work function, conductivity, stress, etc.) to be tuned for optimization of memory cell operation within a NAND assembly.

In some example embodiments, the first material 60 may comprise, consist essentially of, or consist of tungsten (W); the second material 62 may comprise, consist essentially of, or consist of one or both of TiN (titanium nitride) and WN (tungsten nitride); and the third material 64 may comprise, consist essentially of, or consist of one or both of TiSiN (titanium silicon nitride) and WSiN (tungsten silicon nitride); where the formulas indicate primary constituents rather than specific stoichiometries. The tungsten of the first material 60 may be chosen for low resistance. The titanium nitride and/or tungsten nitride of the second material 62 may be chosen to promote strong adhesion with the tungsten, nucleation of large tungsten grains, low stress along the interface with the tungsten, and low cost. The titanium silicon nitride and/or tungsten silicon nitride may be chosen to provide a high work function, which may improve cell operation (e.g., operational speed).

The materials 60, 62 and 64 may have any suitable thicknesses. In some embodiments, the conductive region 22 may have an overall (total) thickness, T, within a range of from about 10 nm to about 100 nm; and each of the first, second and third materials (60, 62 and 64) may have a thickness within a range of from about 10% of the overall thickness to about 90% of the overall thickness. In some embodiments, the second material 62 may be very thin (or even discontinuous); and the materials 60 and 64 will each have a thickness within the range of from about 10% of the overall thickness to about 90% of the overall thickness.

Figure 7:
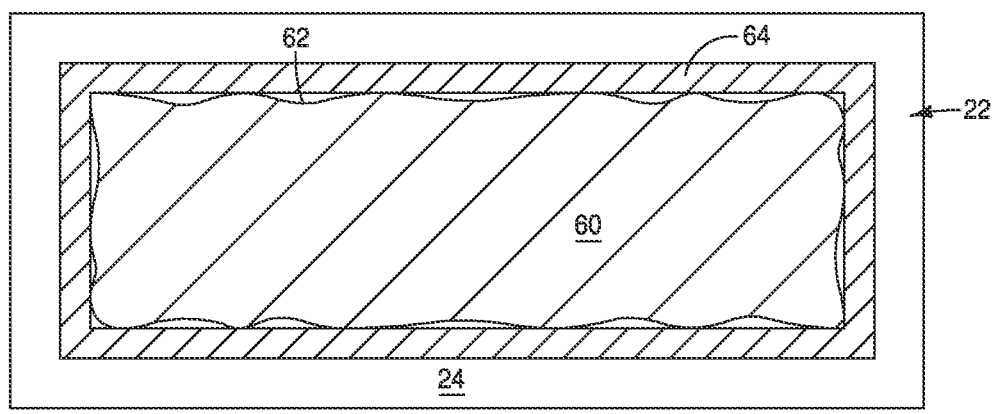
FIG. 7 is another diagrammatic cross-sectional enlarged view of a conductive region of the example memory array of FIG. 5 illustrating another example arrangement of materials within the conductive region.

As discussed above, in some embodiments the second material 62 may be discontinuous. FIG. 7 shows an example embodiment of the conductive region 22 in which the second material 62 is discontinuous. The discontinuous material may be electrically conductive or electrically insulative. The material 62 is shown without crosshatching in FIG. 7 to simplify visualization of the material by the reader as well as to emphasize that the material may be electrically insulative in some embodiments. The discontinuous material 62 may be advantageous if such promotes formation of large grain sizes within the conductive material 60.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell having a conductive gate. The conductive gate includes at least three different materials. The least three different materials include a first material, a second material directly adjacent the first material, and a third material directly adjacent the second material. The first, second and third materials are compositionally different from one another. The first and third materials include metal and are electrically conductive. A charge-blocking region is adjacent the conductive gate. A charge-storage region is adjacent the charge-blocking region. Tunneling material is adjacent the charge-storage region. Channel material is adjacent the tunneling material. The tunneling material being between the channel material and the charge-storage region.

Some embodiments include an assembly having a vertical stack of alternating insulative levels and control gate levels. The control gate levels include conductive regions. The conductive regions include a first metal-containing material, a second metal-containing material along an outer periphery of the first metal-containing material, and a third metal-containing material along an outer periphery of the second metal-containing material. The first, second and third metal-containing materials differ from one another in composition. Charge-storage regions are adjacent the conductive regions. Charge-blocking regions are between the charge-storage regions and the conductive regions.

Some embodiments include a memory array having a vertical stack of alternating insulative levels and control gate levels. Channel material extends vertically along the stack. The control gate levels comprising conductive regions. The conductive regions include three different metal-containing materials. Charge-storage regions are adjacent the control gate levels. Charge-blocking regions are between the charge-storage regions and the conductive regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array, comprising:
   a plurality of wordlines each comprising:
      a core comprising a first metal-containing material;
      an intermediate region around the core, the intermediate region comprising a second metal containing material; and
      an outer region comprising a third metal-containing material around the intermediate region, the first, second and third metal-containing materials each being compositionally different from one another, the second metal-containing material being in direct physical contact with the first metal-containing material and the third metal-containing material, wherein the second metal-containing material is an electrically insulative material having a thickness configured to enable a conductive gate in each wordline to retain conductive properties.

2. The memory array of claim 1 wherein the first metal-containing material comprises one or more of Co, Mo, Ni, Ru and W.

3. The memory array of claim 1 wherein the first metal-containing material consists of one or more of Co, Mo, Ni, Ru and W.

4. The memory array of claim 1 wherein the second metal-containing material comprises a silicon dioxide.

5. The memory array of claim 1 wherein the second metal-containing material is continuous.

6. The memory array of claim 5 wherein the second metal-containing material extends around a periphery of the first metal-containing material.

7. The memory array of claim 1 wherein the third metal-containing material comprises one or more compositions selected from the group consisting of metal nitrides and metal silicon nitrides.

8. The memory array of claim 1 wherein the third metal-containing material has a work function of at least about 4.3 eV at about 20° C.

9. A conductive line, comprising:
a core comprising a first metal-containing material;
an intermediate region around the core, the intermediate region comprising a second metal containing material; and
an outer region comprising a third metal-containing material around the intermediate region, the first, second and third metal-containing materials each being compositionally different from one another, the second metal-containing material being in direct physical contact with the first metal-containing material and the third metal-containing material, wherein the second metal-containing material is an electrically insulative material having a thickness configured to enable a conductive gate in each wordline to retain conductive properties.

10. The conductive line of claim 9 wherein the second metal-containing material is continuous.

11. The conductive line of claim 9 wherein the second metal-containing material is discontinuous.

12. The conductive line of claim 9 wherein the first metal-containing material consists of one or more of Co, Mo, Ni, Ru and W.

13. The conductive line of claim 9 wherein the first metal-containing material has a higher conductivity than each of the second and third metal-containing materials.

14. A string of memory cells, comprising:
a plurality of vertically stacked memory cells, each of the memory cells comprising a conductive structure comprising:
a core comprising a first metal-containing material;
an intermediate region around the core, the intermediate region comprising a second metal containing material that is an electrically insulative material having a thickness configured to enable a conductive gate of the conductive structure to retain conductive properties; and
an outer region comprising a third metal-containing material around the intermediate region, the first, second and third metal-containing materials each being compositionally different from one another; and
a channel material extending vertically through the vertically-stacked memory cells.

15. The strings of memory cells of claim 14 wherein the second metal-containing material comprises a silicon dioxide.

16. The strings of memory cells of claim 14 wherein:
the first metal-containing material consists of W; and
the third metal-containing material comprises one or both of TiSiN and WSiN, where the formulas indicate primary constituents rather than specific stoichiometries.

* * * * *